(12) United States Patent
Hashimoto

(10) Patent No.: US 6,255,691 B1
(45) Date of Patent: Jul. 3, 2001

(54) NONVOLATILE SEMICONDUCTOR MEMORY DEVICE AND MANUFACTURING PROCESS THEREOF

(75) Inventor: Koji Hashimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/216,292

(22) Filed: Dec. 18, 1998

(30) Foreign Application Priority Data

Dec. 19, 1997 (JP) .................................................. 9-350738

(51) Int. Cl.[7] .................................................. H01L 29/72
(52) U.S. Cl. .................... 257/321; 257/315; 438/211; 438/230; 438/257; 438/267
(58) Field of Search .................... 257/321, 315; 438/211, 230, 257, 267

(56) References Cited

U.S. PATENT DOCUMENTS 5,021,848 * 6/1991 Chiu ...................................... 257/321

FOREIGN PATENT DOCUMENTS 5-67790   3/1993   (JP) .

* cited by examiner

Primary Examiner—Edward Wojciechowicz
(74) Attorney, Agent, or Firm—Merhcant & Gould P.C.

(57) ABSTRACT

A floating gate electrode 11 has: a conductive side wall 23 located above a tunnel window 13a, a main part electrode 9 located in the vicinity of the tunnel window 13a and above a channel region 10, and a connecting part 25. The connecting part 25 is located between the conductive side wall 23 and the main part electrode 9 to interconnect the conductive side wall 23 and the main part electrode 9. The region that substantially functions as the tunnel window is determined with the width W1 of the conductive side wall 23.

6 Claims, 6 Drawing Sheets

FIG.5A <PRIOR ART>
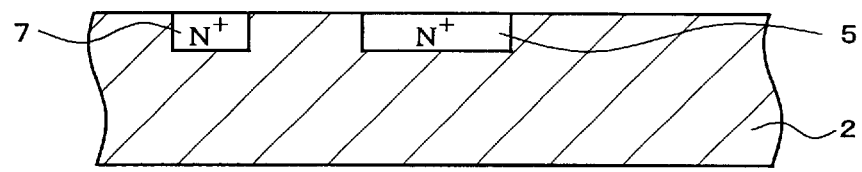
FIG.5B <PRIOR ART>
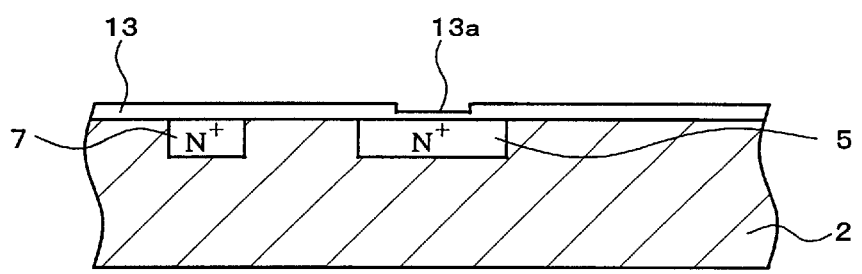
FIG.5C <PRIOR ART>
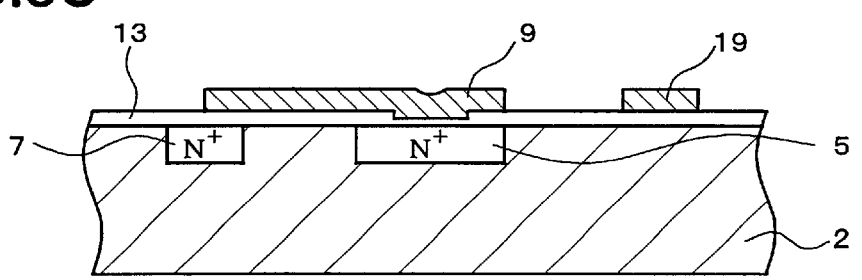

<PRIOR ART>

<PRIOR ART>

NONVOLATILE SEMICONDUCTOR MEMORY DEVICE AND MANUFACTURING PROCESS THEREOF

CROSS-REFERENCE TO THE RELATED APPLICATION

The entire disclosure of Japanese Patent Application No. Hei9-350738 filed on Dec. 19, 1997 including specification, claims, drawings and summary is incorporated herein by reference in its entirely.

1. Field of the Invention

This invention relates to a nonvolatile semiconductor memory device, in particular to the forming of an electrode and a tunnel insulation film partially having a thin film portion.

2. Prior Art

An EEPROM is conventionally known as a nonvolatile semiconductor device which can be switched between write and non-write states by transferring charges through a tunnel oxide film partially having a thin film portion. The manufacturing process for the EEPROM will be described in reference to FIG. 5.

As shown in FIG. 5A, $N^+$ regions 5 and 7 are formed in a semiconductor substrate 2 using a resist (not shown).

Next, it is subjected to thermal oxidation and selective etching to form a tunnel window 13a as a thin film portion. After depositing a polysilicon layer over the entire surface by the CVD process, a resist is used to form a floating gate electrode 9 and a select gate 19 as shown in FIG. 5C. After forming an ONO film and a polysilicon layer over the entire surface, a resist is used to form an ONO film 14 and a control gate electrode 29 as shown in FIG. 6A. As shown in FIG. 6B, using the select gate electrode 19 and the control gate electrode 29 as masks, impurities are implanted into the substrate 2. As a result, sources 3 and 6, and a drain 4 of a memory transistor and a select transistor are formed in the semiconductor substrate 2.

The manufacturing process described above, however, has the following problems: First, since separate masks are used to form the $N^+$ region 5, the tunnel window 13a, and the floating gate electrode 9, the size of a cell increases by the dimension for possible displacement of the masks. In other words, the conventional process cannot achieve minute dimensioning depending on the performance of the exposure device used.

If it is possible to reduce the size of the tunnel window 13a, minute dimensioning can be achieved without sacrificing the performance. The reason is as follows: If the size of the tunnel window 13a can be reduced, the floating gate electrode 9 can be made small while maintaining a coupling ratio. This makes it possible to reduce the cell size while maintaining a voltage applied to the tunnel oxide film relative to the voltage applied to the control gate electrode 29. In other words, the cell size can be made minute while maintaining writing speed and the like.

DISCLOSURE OF THE INVENTION

The object of the invention is to provide a nonvolatile semiconductor memory device and its manufacturing process capable of solving the above problem, reducing the effective dimensions of the tunnel window, and achieving minute dimensioning without sacrificing its performance.

The nonvolatile semiconductor memory device comprises a semiconductor substrate, a first region provided in the semiconductor substrate, a second region provided so as to form a region capable of creating an electric channel between the first region, and the region capable of forming the electric channel, the first insulation film having a thin film portion of a thickness smaller on the first region than on the region capbale of forming the electric channel a floating electrode provided over the first insulation film to store electric charges, the floating electrode having a conductive side wall located over the thin film portion, and a main part located in the vicinity of the thin film portion and a main part located in the vicinity of the thin film portion and above the region capable of forming the electric channel, a lower region formed between the side wall and the main part being electrically isolated by an isolation layer and an upper region formed between the side wall and the main part being electrically connected by a conductive connection part a second insulation film provided on the floating electrode, and a control electrode provided on the second insulation film.

A nonvolatile semiconductor memory device comprises a semiconductor substrate of a first conductive type region formed in the semiconductor substrate, a second conductive type region formed in the semiconductor substrate, a tunnel oxide film formed on the first conductive type region comprising having a thin film portion over the second conductive type region, and a floating electrode capable of switching between write and non-write states by transferring electric charges to and from the second conductive type region through the thin film portion, the floating electrode comprises a conductive side wall located over the thin film portion, and a main part located in the vicinity of the thin film portion and above part of the tunnel oxide film, a lower region formed between the conductive side wall and the main part being electrically isolated by an isolation layer and an upper region formed between the conductive side wall and the main part being electrically connected by a conductive connection part.

A process for manufacturing a nonvolatile semiconductor memory device capable of switching between write and non-write states by transferring electric charges between the floating electrode and the second conductive type region of the first conductive type substrate through the thin film portion of the tunnel oxide film, comprises the steps of forming a main part of the floating electrode for storing electric charges on the insulation film formed on the substrate, partially removing the insulation film around the side wall of the floating electrode using the floating electrode as a mask, forming the oxide film of a specified thickness on the substrate surface where the insulation film has been removed, thereby forming the tunnel oxide film having the thin film portion, forming the conductive side wall on the side wall of the main part and the thin film portion, and partially removing the insulation layer formed between the main part and the conductive side wall, thereby electrically connecting between the conductive side wall and the upper region of the main part.

The features, other objects, applications, and effects of the invention will become clearer in reference to the embodiments and appended drawings.

BRIEF DESCRIPTION OF THE DRAWINGS

FIGS. 5A through 5C show the conventional manufacturing process of the EEPROM.

DESCRIPTION OF THE PREFERRED EMBODIMENTS

Figure 1:
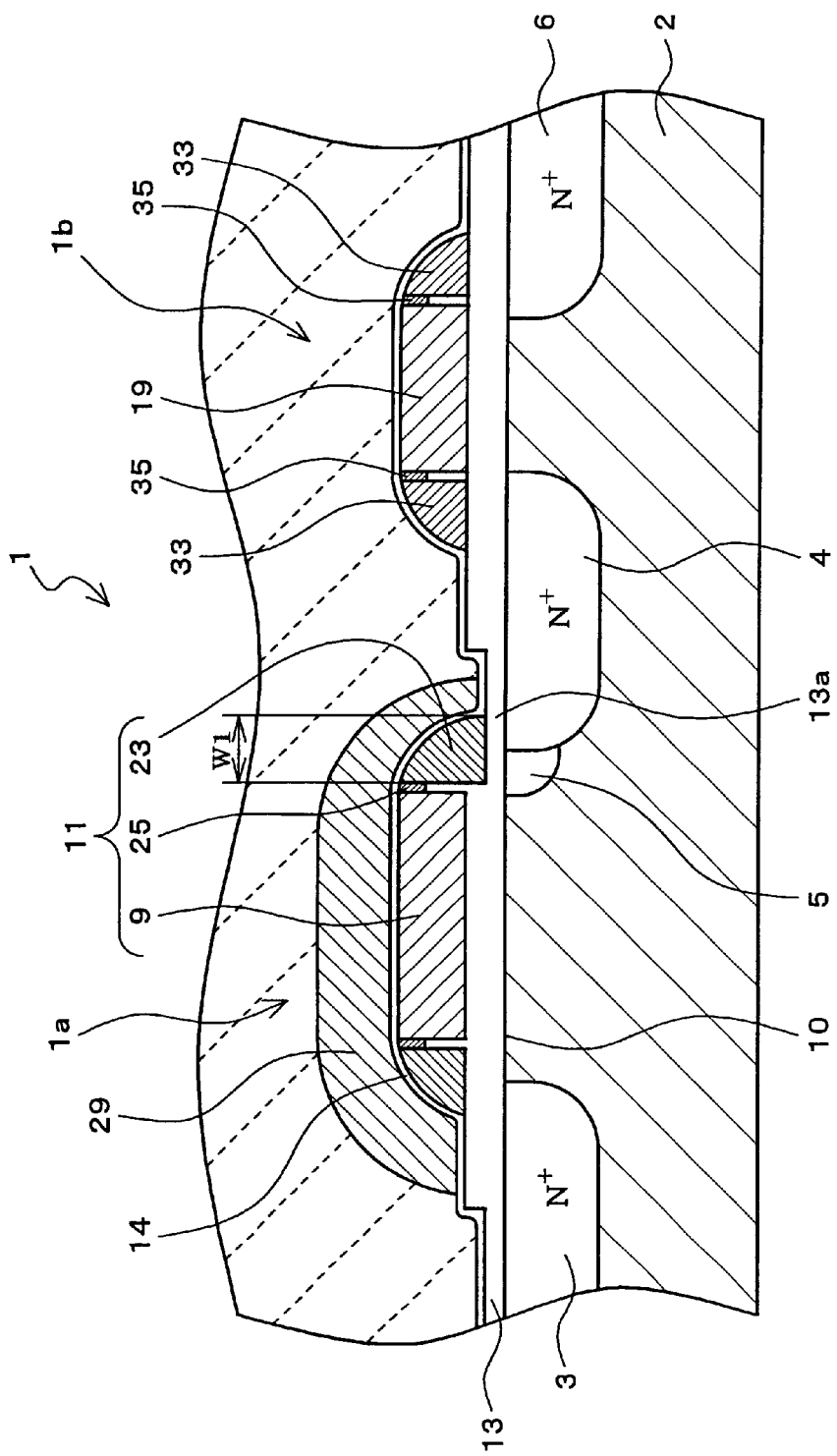
FIG. 1 is a cross-sectional view of an essential part of an EEPROM 1 of the invention.

The structure of the EEPROM 1 of the invention will be described in reference to the appended drawings. The EEPROM 1 has a memory transistor 1a and a select transistor 1b. In a substrate 2 are formed; a drain 4 as a first region of the memory transistor, and a source 3 as a second region of the memory transistor; and a source 6 of the select transistor. The drain 4 is shared with the memory transistor and the select transistor. In this embodiment, a P-type substrate 2 is used, with the drain 4, sources 3 and 6 being made as $N^+$ regions. The drain 4 has an $N^+$ region 5 containing a slightly lower impurity concentration.

The region between the drain 3 and the source 4 is a channel region 10 where an electric path can be formed.

A tunnel oxide film 13 as a first insulation film is formed on the drain 4 and the channel region 10. The tunnel oxide film 13 has on the drain 4 a tunnel window 13a as a thin film portion thinner than the part of the film located on the channel region 10.

A floating gate electrode 11 of the floating type is formed on the tunnel oxide film 13. The floating gate electrode 11 has a conductive side wall 23 located on the tunnel window 13a, a main part electrode 9 located in the vicinity of the tunnel window 13a and on the channel region 10, and a connecting portion 25. The connecting portion 25 is located between the conductive side wall 23 and the main part electrode 9 to electrically interconnect them.

An ONO film 14 as a second insulation film is formed over the floating gate electrode 11. A control gate electrode 29 is formed over the ONO film 14.

Conductive side walls 33, like in the memory transistor, are also formed on both sides of the gate electrode 19 of the select transistor 1b, and are electrically connected through a connecting portion 35 to the gate electrode 19.

Figure 2A:
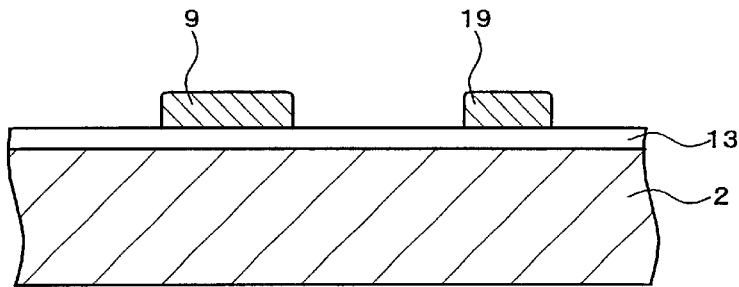
FIGS. 2A through 2C show manufacturing steps of the EEPROM 1 of the invention.

Next, the manufacturing process for the EEPROM 1 will be described. First, as shown in FIG. 2A, a silicon oxide film ($SiO_2$) 13 of an approximate thickness of 350 angstroms is formed on the surface of the substrate 2. A main part electrode 9 and a select gate 19 are formed using the CVD process and a resist (not shown).

Figure 2B:
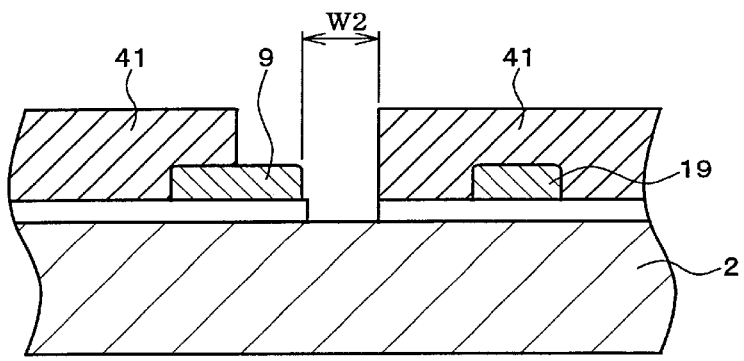
Figure 2C:
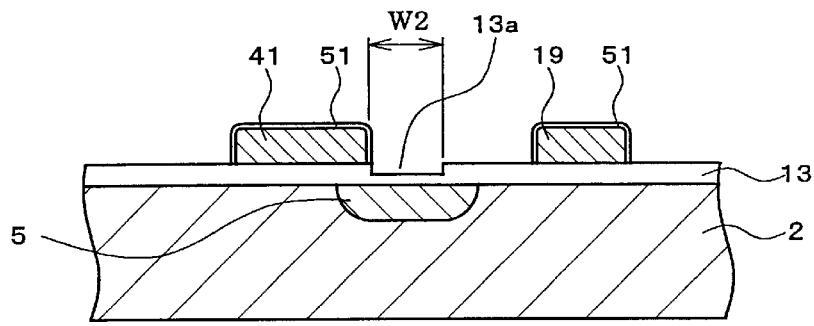

To form the $N^{30}$ region 5, and the tunnel window 13a as a thin film portion, as shown in FIG. 2B, a resist 41 is formed spaced from the main part electrode 9 by a distance W2, and the tunnel oxide film 13 is temporarily removed. In this state, N-type impurities are implanted with the resist 41 and the main part electrode 9 being used as masks. After that, the resist 41 is removed and a silicon oxide film of a thickness of 80 to 100 angstroms is formed. As a result, the tunnel window 13a as a thin oxide film is formed as shown in FIG. 2C. At this time, a silicon oxide film 51 is formed also on the surfaces of the main part electrode 9 and the select gate electrode 19.

Figure 3A:
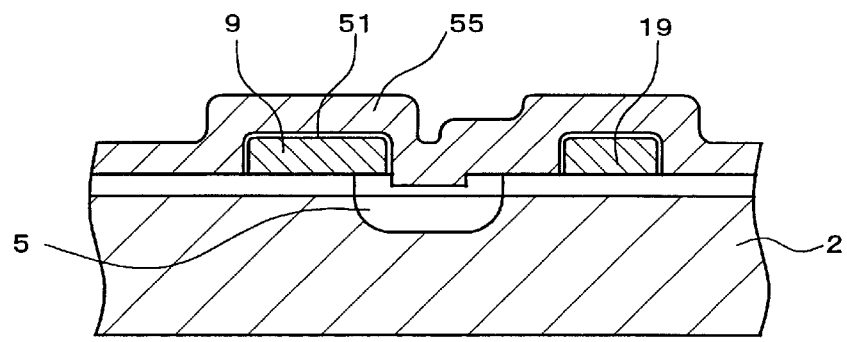
FIGS. 3A through 3D show manufacturing steps of the EEPROM 1 of the invention.
Figure 3B:
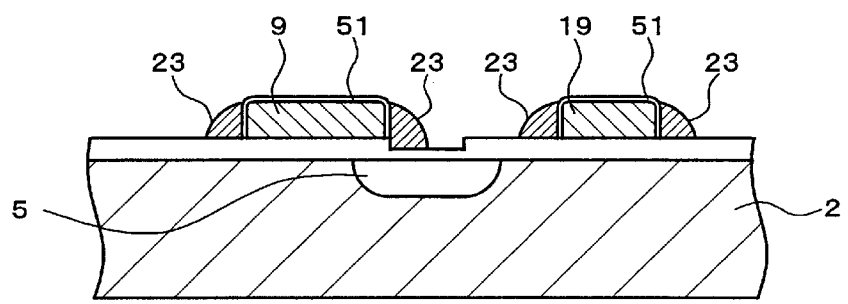

A polysilicon layer 55 is deposited to a thickness of 0.2 micrometers as shown in FIG. 3A using the CVD process. From this state, the polysilicon layer 55 is etched back with anisotropic etching using reactive ion etching (RIE) so that the conductive side walls 23 are left as shown in FIG. 3B.

By the way, even if the etching back is made for an extended period of time, the etching proceeds in the vertical direction only, so the width W1 of the conductive side wall 23 is little affected. Therefore, it is possible to precisely control the width W1 of the conductive side walls 23 (see Fig.1) . In other words, since the width W1 of the conductive side walls 23 are determined with the thickness of the polysilicon layer 55 which can be precisely controlled, the conductive side wall 23 may be formed more accurately than when a mask is used.

Figure 3C:
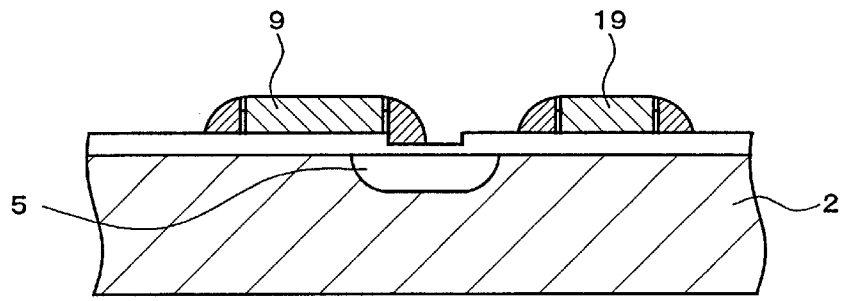
Figure 3D:
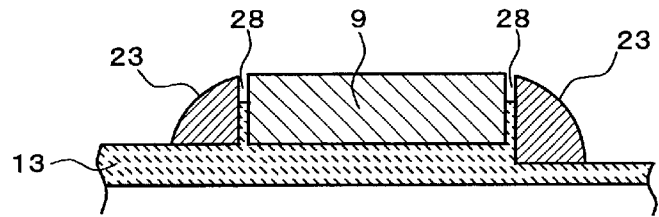

The silicon oxide film 51 is wet-etched to partially remove the silicon oxide film located between the main part electrode 9 and the conductive side walls 23 as shown in FIG. 3C. As a result, as shown in FIG. 3D, a gap 28 is formed in the upper part of the space between the main part electrode 9 and the conductive side walls 23. A gap is similarly formed with respect to the gate electrode 19 of the select transistor. The removal of the silicon oxide film between the main part electrode 9 and the conductive side walls 23 has only to be made to the extent that permits electrical interconnection between the main part electrode 9 and the conductive sidewalls 23. Depending on cases, it may be totally removed.

Figure 4A:
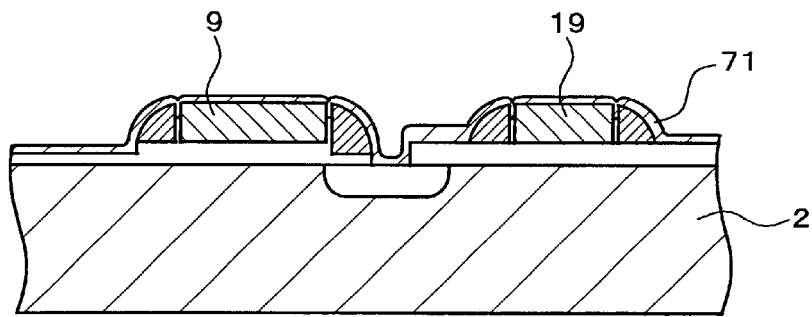
FIGS. 4A through 4C show manufacturing steps of the EEPROM 1 of the invention.
Figure 4B:
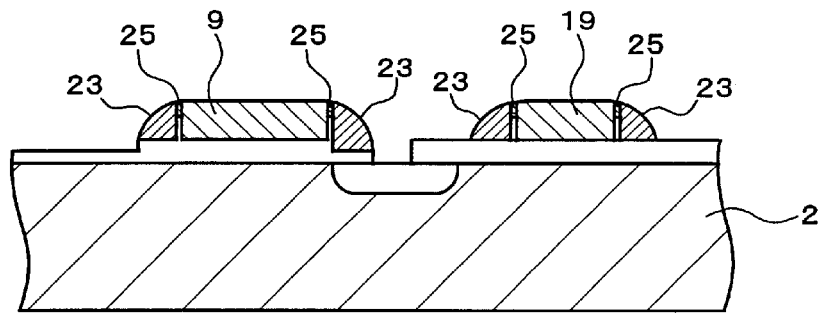

A polysilicon layer 71 of an approximate thickness of 500 angstroms is formed over the entire surface as shown in FIG. 4A. From this state, an anisotropic etching is made using the reactive ion etching (RIE). As a result, as shown in FIG. 4B, a connecting portion 25 of polysilicon is formed in the gap 28. The conductive side wall 23 and the main part electrode 9 are interconnected through the connecting portion 25.

Figure 4C:
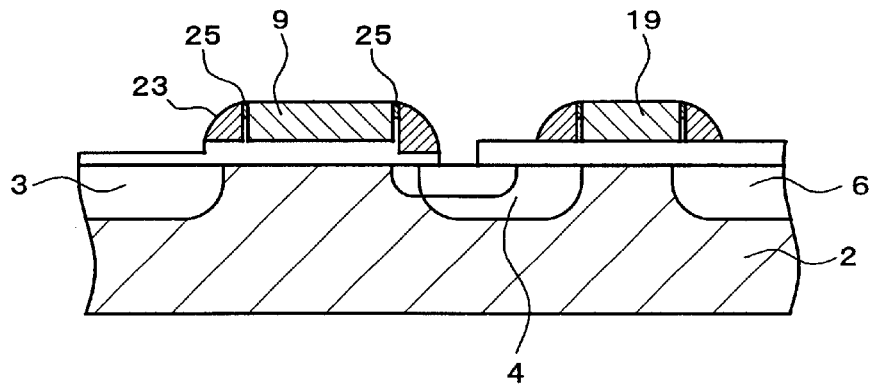
Figure 6A:
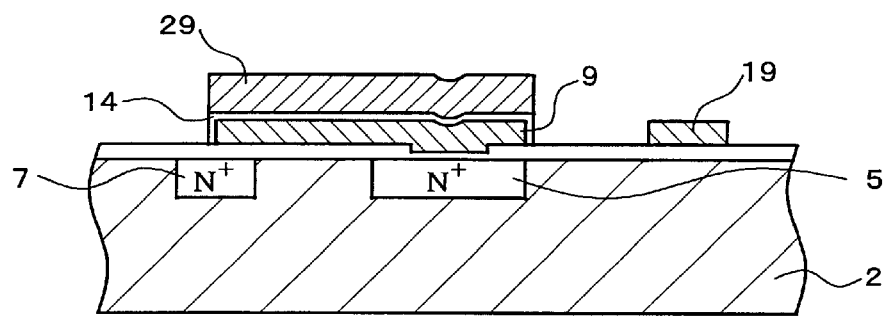
FIGS. 6A and 6B show the conventional manufacturing process of the EEPROM.
Figure 6B:
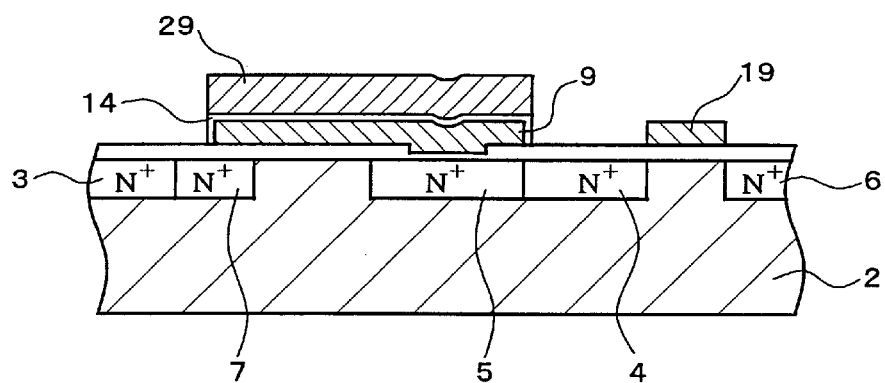

After that, like the conventional process, ions of N-type impurities are implanted with the conductive side wall 23 , the main part electrode 9, and the select gate electrode 19 being used as masks. As a result, as shown in FIG. 4C, the sources and the drain of the memory transistor 1a and the select transistor 1b are formed. After that, the EEPROM 1 shown in FIG. 1 is completed by forming the ONO film, control gate electrode, and inter-layer insulation films, and making required wiring.

As described above, in the above EEPROM 1, the size (width) of the region having the substantial function of the tunnel window may be reduced. In other words, minute dimensioning may be achieved while maintaining the coupling ratio unchanged. The effective width W1 of the tunnel window 13a for transferring charges may be determined with the width of the conductive side wall 23 because the conductive side wall 23 is formed and connected to the main part electrode 9 on the tunnel window 13a. The width W1 of the tunnel window 13a may be accurately determined irrespective of the width W2 (shown in FIG. 2C) of the tunnel window 13a determined with the resist since the width of the conductive side wall 23 may be determined with the silicon oxide film 55 shown in FIG. 3A.

While this embodiment is described as the case in which the invention is applied to the EEPROM having the select transistor, the invention may also be applied to flash memories or the nonvolatile memories having no select transistor. In other words, the invention may be applied to any nonvolatile semiconductor memory as long as it may be switched between write and non-write states by transferring charges between the floating electrode and the impurity region of the substrate through the thin film portion of the tunnel oxide film.

While this embodiment is constituted that the silicon oxide film (insulation material) present in the gap between the main part electrode 9 and the conductive side wall 23 is partially removed to form a polysilicon-made connecting portion as a means for interconnecting both of the parts, the means is not limited to such a constitution but any means for interconnecting the main part electrode 9 and the conductive side wall 23 may be used.

In the nonvolatile semiconductor memory device of this invention, the floating electrode has the conductive side wall and the main part located above the region capable of forming the electric path and in the vicinity of the thin film portion, and the conductive side wall is electrically connected to the main part. Therefore, the effective area of the thin film portion for transferring electric charges is determined with the size of the conductive side wall. As a result, minute dimensioning may be achieved.

In the nonvolatile semiconductor memory device of this invention, the floating electrode has the conductive side wall and the main part located in the vicinity of the thin film portion and above the tunnel oxide film excluding the thin film portion, and electrically connected to the conductive side wall. Therefore, the effective area of the thin film portion for transferring electric charges is determined with the size of the conductive side wall. As a result, minute dimensioning may be achieved.

According to the manufacturing process for the nonvolatile semiconductor memory device of this invention, a main part of the floating electrode for storing charges is formed on an insulation film formed on a substrate, and the insulation film around the side wall of the floating electrode is partially removed, with the floating electrode being used as a mask. An oxide film of a specified thickness is formed on the substrate surface from which the insulation film has been removed. Thus, a tunnel oxide film having a thin film portion is formed. A conductive side wall is formed over the thin film portion and on the side wall of the main part to electrically interconnect the main part and the conductive side wall. The effective area of the tunnel oxide film is determined with the size of the conductive side wall. As a result, minute dimensioning may be achieved.

According to the manufacturing process for the nonvolatile semiconductor memory device of this invention, the conductive side wall is formed on the side wall of the main part over the thin film portion by forming a conductive layer over the entire surface, followed by anisotropic etching. Therefore, the size of the conductive side wall may be determined with the thickness of the conductive layer. This makes it possible to manufacture a nonvolatile semiconductor memory device having a minute charge transfer window.

According to the manufacturing process for the nonvolatile semiconductor memory device of this invention, when part of the insulation film around the side wall of the floating electrode is removed, first conductive type impurities are implanted into the substrate with the floating electrode being used as a mask. Therefore, a mask for forming the region for introducing the first conductive type impurities into the substrate becomes unnecessary, and the relationship between the region for introducing the first conductive type impurities and the main part may be determined by self-alignment.

According to the manufacturing process for the nonvolatile semiconductor memory device of this invention, the electrical connection between the main part side surface and the conductive side wall is made by partially removing the insulation film between the main part side surface and the conductive side wall and depositing a conductive material layer between them. Therefore, no separate wiring is necessary for electrical connection between the two.

While the invention is described above in the forms of preferable embodiments, each term is used not for the purpose of limitation but explanation, and therefore, may be changed within the scope of the appended claims without departing from the scope and spirit of the invention.

What is claimed is:

1. A nonvolatile semiconductor memory device comprising:
    a semiconductor substrate;
    first regions provided in the semiconductor substrate;
    a second region provided so as to form a region capable of creating an electric channel between the first regions;
    a first insulation film provided to extend over one of the first regions and the region capable of creating an electric channel, the first insulation film having a thin film portion of a thickness smaller on at least a portion of said one of the first regions than on the region capable of creating an electric channel;
    a floating electrode provided over the first insulation film to store electric charges;
    the floating electrode having a conductive side wall located over the thin film portion, and a main part located in the vicinity of the thin film portion and above the region capable of creating an electric channel, said floating electrode also having an isolation layer and a conductive connection part such that a lower region formed between the side wall and the main part is electrically isolated by the isolation layer and an upper region formed between the side wall and the main part is electrically connected by the conductive connection part;
    a second insulation film provided on the floating electrode; and
    a control electrode provided on the second insulation film.

2. A nonvolatile semiconductor memory device comprising:
    a semiconductor substrate of a first conductive type to form a first conductive type region;
    a second conductive type region formed in the semiconductor substrate;
    a tunnel oxide film formed on at least a portion of the first conductive type region comprising a thin film portion over at least a portion of the second conductive type region; and
    a floating electrode, capable of switching between write and non-write states by transferring electric charges to and from the second conductive type region through the thin film portion, comprising:
        a conductive side wall located over the thin film portion;
        a main part located in the vicinity of the thin film portion and above at least part of the tunnel oxide film; and
        an isolation layer and a conductive connection part such that a lower region formed between the conductive side wall and the main part is electrically isolated by the isolation layer and an upper region formed between the conductive side wall and the main part is electrically connected by the conductive connection part.

3. A process for manufacturing the nonvolatile semiconductor memory device capable of switching between write and non-write states by transferring electric charges between a floating electrode and in a substrate a conductive type region through a thin film portion of a tunnel oxide film, comprising the steps of:

forming an insulation film on the substrate and forming a main part of the floating electrode for storing electric charges on the insulation film;

partially removing the insulation film around a side wall of the floating electrode using the floating electrode as a mask;

forming an oxide film of a predetermined thickness thinner than the insulation film on at least the main part and on the substrate where the insulation film has been removed, thereby from the insulation film and the oxide film forming the tunnel oxide film having the thin film portion;

forming the conductive side wall on the insulation film on the side wall of the main part and on the thin film portion; and partially removing the insulation film formed between the main part and the conductive side wall, thereby avoiding completely insulating so that there can be an electrical connection between the conductive side wall and an upper region of the main part.

4. The process for manufacturing the nonvolatile semiconductor memory device of claim 3, wherein the conductive side wall is formed on the side wall of the main part and the thin film portion by an isotropic etching after forming a conductive material layer over the entire surface.

5. The process for manufacturing the nonvolatile semiconductor memory device of claim 3, wherein a conductive type of impurities is implanted into the substrate while using the floating electrode as a mask when the insulation film around the side wall of the floating electrode is partially removed.

6. The process for manufacturing the nonvolatile semiconductor memory device of claim 3, wherein the electric interconnection between a side surface of the main part and a side wall is made by depositing a conductive layer after the insulation film between the main part side wall and the conductive side wall is partially removed.

* * * * *